United States Patent
Lu et al.

(10) Patent No.: US 9,628,061 B2
(45) Date of Patent: Apr. 18, 2017

(54) POWER DROP DETECTOR CIRCUIT AND OPERATING METHOD OF SAME

(71) Applicant: Macronix International Co., Ltd., Hsinchu (TW)

(72) Inventors: Kuan-Ming Lu, Kaohsiung (TW); Chun-Hsiung Hung, Hsinchu (TW); Chun-Yi Lee, Hsinchu (TW); Ken-Hui Chen, Hsinchu (TW); Kuen-Long Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/860,761

(22) Filed: Sep. 22, 2015

(65) Prior Publication Data

US 2016/0204772 A1 Jul. 14, 2016

Related U.S. Application Data

(60) Provisional application No. 62/103,291, filed on Jan. 14, 2015.

(51) Int. Cl.
*H03K 5/153* (2006.01)
*H03K 5/1534* (2006.01)

(52) U.S. Cl.
CPC .................. *H03K 5/1534* (2013.01)

(58) Field of Classification Search
CPC .............................. H03K 5/153; H03K 5/1534
USPC ......................................... 327/50, 77, 78, 88
See application file for complete search history.

(56) References Cited

U.S. PATENT DOCUMENTS

| | | | | |
|---|---|---|---|---|
| 4,196,362 A | * | 4/1980 | Maehashi | H03K 17/223 327/143 |
| 5,097,146 A | * | 3/1992 | Kowalski | G01R 19/16557 327/77 |
| 5,278,458 A | * | 1/1994 | Holland | H03K 17/302 327/142 |
| 5,723,990 A | * | 3/1998 | Roohparvar | H03K 5/153 327/142 |
| 5,838,173 A | * | 11/1998 | Oh | G01R 19/16552 327/77 |
| 5,923,069 A | * | 7/1999 | Park | H03K 5/08 257/365 |
| 6,104,221 A | * | 8/2000 | Hoon | H03K 17/223 327/143 |
| 8,451,028 B2 | * | 5/2013 | Chen | H03K 3/0375 327/199 |
| 2002/0163364 A1 | * | 11/2002 | Majcherczak | H03K 17/223 327/78 |
| 2004/0130355 A1 | * | 7/2004 | Oyama | H03K 5/153 327/78 |
| 2006/0082393 A1 | * | 4/2006 | Maher | G01R 19/16538 327/77 |

* cited by examiner

*Primary Examiner* — William Hernandez
(74) *Attorney, Agent, or Firm* — Finnegan, Henderson, Farabow, Garrett & Dunner LLP

(57) ABSTRACT

A power drop detector circuit includes a detect element, for coupling to a first source voltage, for detecting a voltage level of the first source voltage, and a memory element coupled to the detect element and switchable between a first memory state and a second memory state based on the voltage level of the first source voltage.

17 Claims, 7 Drawing Sheets

POWER DROP DETECTOR CIRCUIT AND OPERATING METHOD OF SAME

PRIORITY CLAIM

This disclosure claims priority under 35 U.S.C. §119 to U.S. provisional patent application No. 62/103,291 filed on Jan. 14, 2015, entitled "Power Drop Detector Without DC Power Consumption." The aforementioned application is incorporated herein by reference in its entirety.

FIELD OF THE DISCLOSURE

The present disclosure relates to a power drop detector circuit and operation method of the same and, more particularly, to a power drop detector circuit that can detect whether or not a source voltage drops below a trigger level.

BACKGROUND

A memory device can be electrically programmed to store data. The data is retained in the memory device until the memory device is electrically erased. In some applications, after the memory device is programmed, the memory device is operated in a low power consumption mode in which no current flows through the memory device. However, when the memory device operates in the low power consumption mode, a sudden power drop may corrupt the data stored in the memory device.

SUMMARY

According to an embodiment of the disclosure, a power drop detector circuit includes a detect element, for coupling to a first source voltage, for detecting a voltage level of the first source voltage, and a memory element coupled to the detect element and switchable between a first memory state and a second memory state based on the voltage level of the first source voltage.

According to another embodiment of the disclosure, a method for operating a power drop detector circuit includes providing a detect element for detecting a voltage level of the first source voltage and a memory element switchable between a first memory state and a second memory state, and in response to the voltage level of the first source voltage dropping below a trigger level, switching the memory element from the first memory state to the second memory state.

The accompanying drawings, which are incorporated in and constitute a part of this specification, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
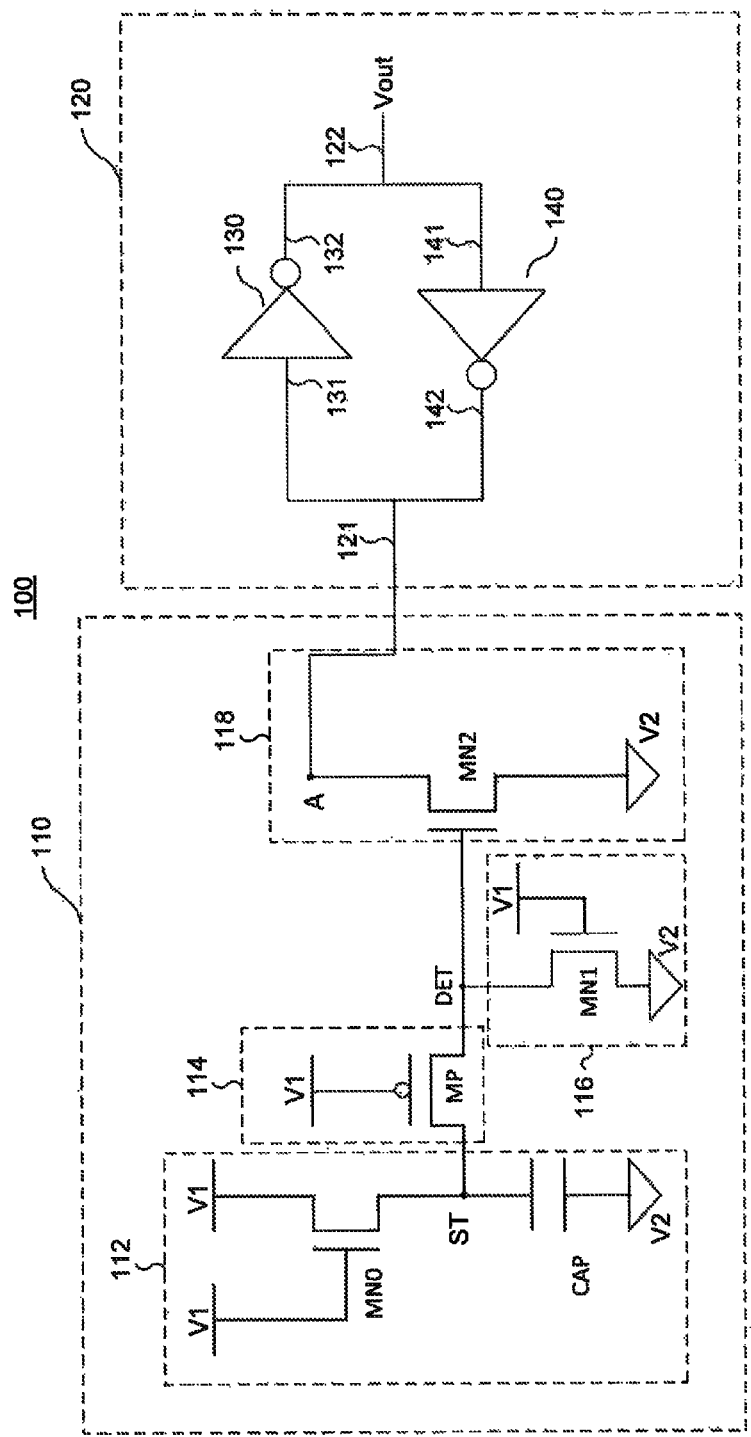
FIG. 1 is a circuit diagram of a power drop detector circuit according to an illustrated embodiment.

FIG. 1 is a circuit diagram of a power drop detector circuit 100 (hereinafter referred to as "circuit 100"), according to an illustrated embodiment. Circuit 100 includes a detect element 110 and a memory element 120. Detect element 110 detects whether or not a voltage level of a first source voltage drops below a trigger level. Memory element 120 stores the results of the detection performed by detect element 110. Memory element 120 can be switched between a first memory state and a second memory state. The first memory state indicates that the voltage level of the first source voltage is higher than the trigger level. The second memory state indicates that the voltage level of the first source voltage drops below the trigger level.

As illustrated in FIG. 1, detect element 110 includes a latching circuit 112, a pull-up circuit 114, a pull-down circuit 116, and a memory control circuit 118. Latching circuit 112 is coupled between a first source voltage V1 and a second source voltage V2. Second source voltage V2 can be a reference voltage such as ground. Latching circuit 112 is controlled by first source voltage V1. Latching circuit 112 includes an N-channel metal-oxide-semiconductor (NMOS) transistor MN0 and a capacitor CAP. NMOS transistor MN0 includes a drain terminal coupled to first source voltage V1, a source terminal coupled to a node ST, and a gate terminal coupled to first source voltage V1. Capacitor CAP includes a first terminal coupled to node ST, and a second terminal coupled to second source voltage V2.

Pull-up circuit 114 is coupled between node ST and a detector node DET, and is controlled by first source voltage V1. Pull-up circuit 114 includes a P-channel metal-oxide-semiconductor (PMOS) transistor MP. PMOS transistor MP includes a source terminal coupled to node ST, a drain terminal coupled to detector node DET, and a gate terminal coupled to the first source voltage V1.

Pull-down circuit 116 is coupled between detector node DET and second source voltage V2, and is controlled by first source voltage V1. Pull-down circuit 116 includes an NMOS transistor MN1. NMOS transistor MN1 includes a drain terminal coupled to detector node DET, a source terminal coupled to second source voltage V2, and a gate terminal coupled to first source voltage V1.

Memory control circuit 118 is coupled between a node A and second source voltage V2, and is controlled by voltage $V_{DET}$ at detector node DET. Memory control circuit 118 includes an NMOS transistor MN2. NMOS transistor MN2 includes a drain terminal coupled to a node A, a source terminal coupled to ground, and a gate terminal coupled to detector node DET.

Memory element 120 includes a memory input node 121, a memory output node 122, and a first inverter 130 and a second inverter 140 coupled between memory input node 121 and memory output node 122. Memory input node 121 is coupled to node A of memory control circuit 118. Memory output node 122 is coupled to an external circuit (not illustrated). First inverter 130 includes an input terminal 131 coupled to memory input node 121, and an output terminal 132 coupled to memory output node 122. Second inverter 140 includes an input terminal 141 coupled to memory output node 122, and an output terminal 142 coupled to memory input node 121. The voltage on memory output node 122 is Vout.

Figure 2:
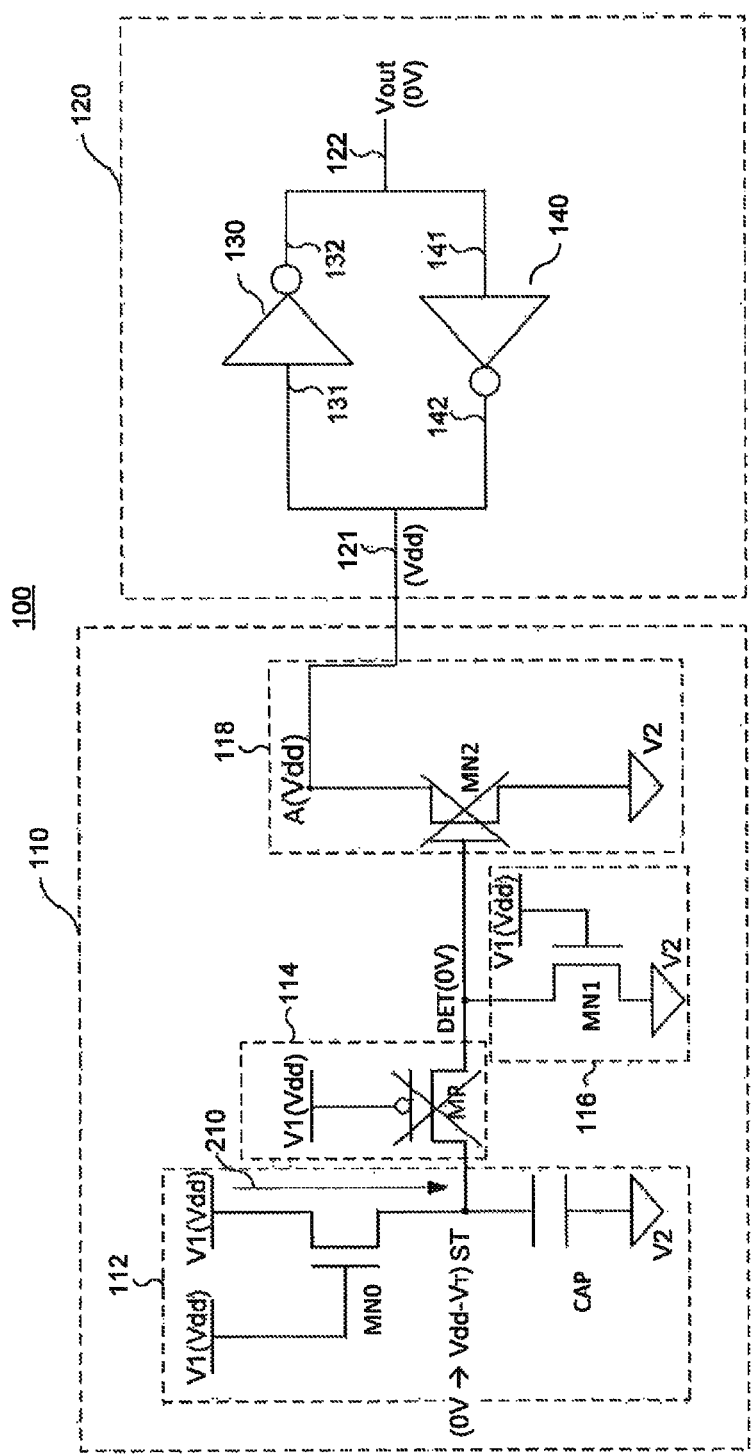
FIG. 2 is a circuit diagram of the power drop detector circuit of FIG. 1 during an initialization operation, according to an illustrated embodiment.

FIG. 2 is a circuit diagram of circuit 100 during an initialization operation immediately after power is turned on, according to an illustrated embodiment. Before the initialization operation, i.e., before power is turned on, first source voltage V1 is 0V, capacitor CAP is fully discharged, and voltages $V_{ST}$, $V_{DET}$, and $V_A$ at node ST, detector node DET, and node A are 0V.

As illustrated in FIG. 2, when power is turned on, the first source voltage V1 is set to a positive voltage level Vdd, which is higher than a trigger level $V_T$. $V_T$ is the threshold voltage of each one of NMOS transistors MN0, MN1, and MN2. Because the gate to source voltage Vgs (i.e., the difference between the voltage level at the gate terminal and the voltage level at the source terminal) of NMOS transistor MN0 of latching circuit 112 is Vdd which is higher than $V_T$, NMOS transistor MN0 is turned on and conducts a current 210 from first source voltage V1 (i.e., Vdd) to node ST, which is coupled to the first terminal of capacitor CAP of latching circuit 112. As a result, capacitor CAP is charged by current 210, and voltage $V_{ST}$ at node ST starts to increase from 0V. When voltage $U_{ST}$ reaches Vdd-$V_T$, the gate to source voltage Vgs of NMOS transistor MN0 becomes $V_T$, and thus NMOS transistor MN0 is turned off. Therefore, voltage $V_{ST}$ at node ST is latched at Vdd-$V_T$ by NMOS transistor MN0 and capacitor CAP of latching circuit 112. At the same time, because the gate to source voltage Vgs of PMOS transistor MP of pull-up circuit 114 is Vdd, PMOS transistor MP is turned off. Because the gate to source voltage Vgs of NMOS transistor MN1 of pull-down circuit 116 is Vdd, NMOS transistor MN1 is turned on. As a result, voltage $V_{DET}$ at detector node DET is pulled down by pull-down circuit 116 to the same level of second source voltage V2, i.e., 0V. Because voltage $V_{DET}$ at detector node DET is 0V, the gate to source voltage Vgs of NMOS transistor MN2 of memory control circuit 118 is 0V, and thus NMOS transistor MN2 is turned off. In addition, the voltage level at memory input node 121 is set by an external circuit (not illustrated) to be equal to first source voltage V1, i.e., Vdd, and the voltage level voltage Vout at memory output node 122 is set by operation of first inverter 130 to be equal to second source voltage V2, i.e., 0V. As a result, memory element 120 is set at the first memory state.

Figure 3:
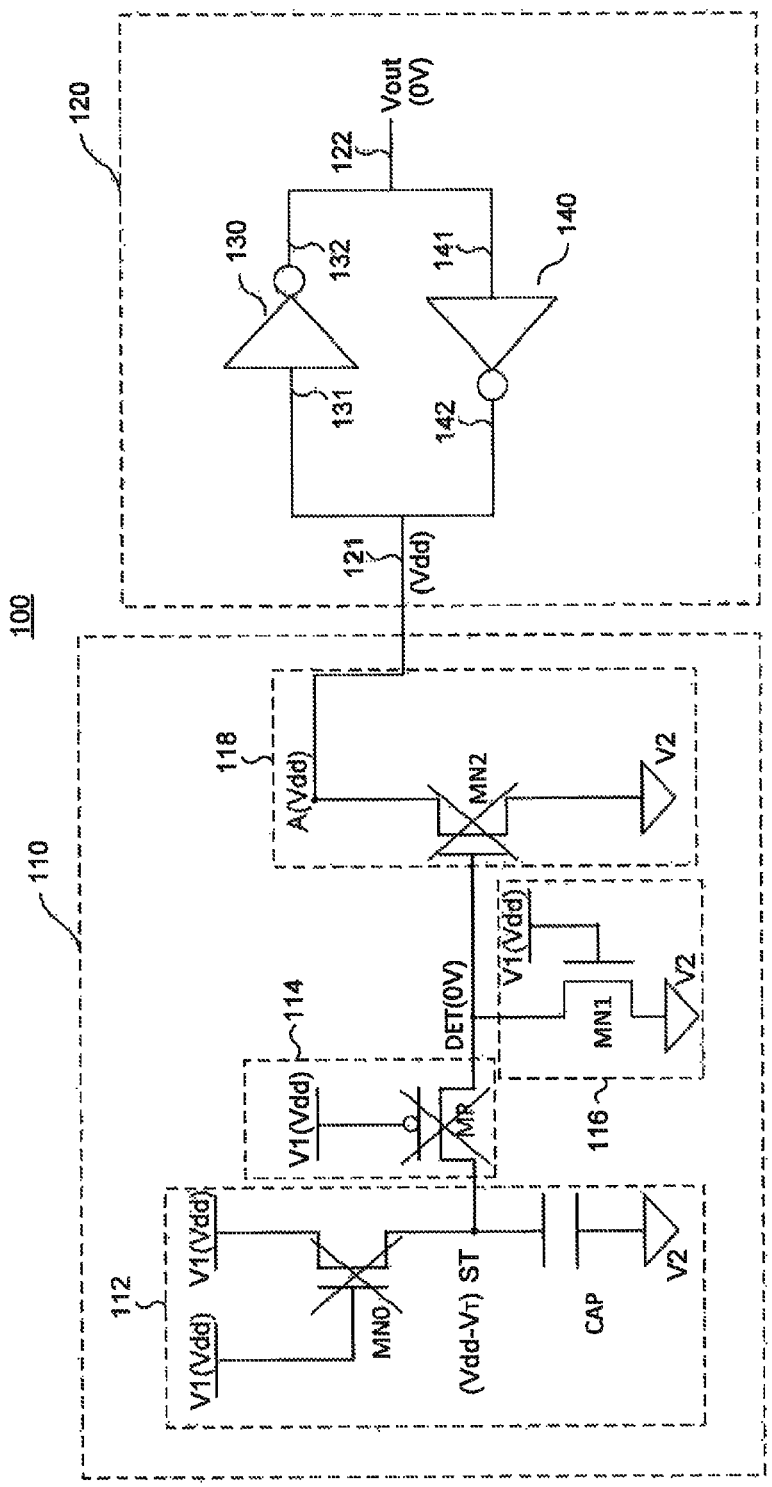
FIG. 3 is a circuit diagram of the power drop detector circuit of FIG. 1 during normal operation, according to an illustrated embodiment.

FIG. 3 is a circuit diagram of circuit 100 during normal operation, according to an illustrated embodiment. During normal operation, first source voltage V1 is maintained at Vdd, which is higher than the trigger level $V_T$. Because voltage $V_{ST}$ at node ST is latched at Vdd-$V_T$ by latching circuit 112, NMOS transistor MN0 remains turned off. At the same time, responsive to first source voltage V1 being Vdd, PMOS transistor MP of pull-up circuit 114 and NMOS transistor MN2 of memory control circuit 118 remain turned off, and NMOS transistor MN1 of pull-down circuit 116 remains turned on. As a result, $V_{DET}$ remains as 0V, $V_A$ remains as Vdd, and Vout remains as CV. Consequently, memory element 120 remains in the first memory state, indicating that the first source voltage V1 does not drop below the trigger level $V_T$.

During normal operation, only NMOS transistor MN1 is turned on. However, because voltage $V_{DET}$ at the drain terminal of NMOS transistor MN1 is the same as second source voltage V2 (i.e., 0V) at the source terminal of NMOS transistor MN1, no current flows through NMOS transistor MN1. Therefore, no current flows through the entire circuit 100. In other words, circuit 100 does not consume any direct current (DC) power during normal operation.

Figure 4:
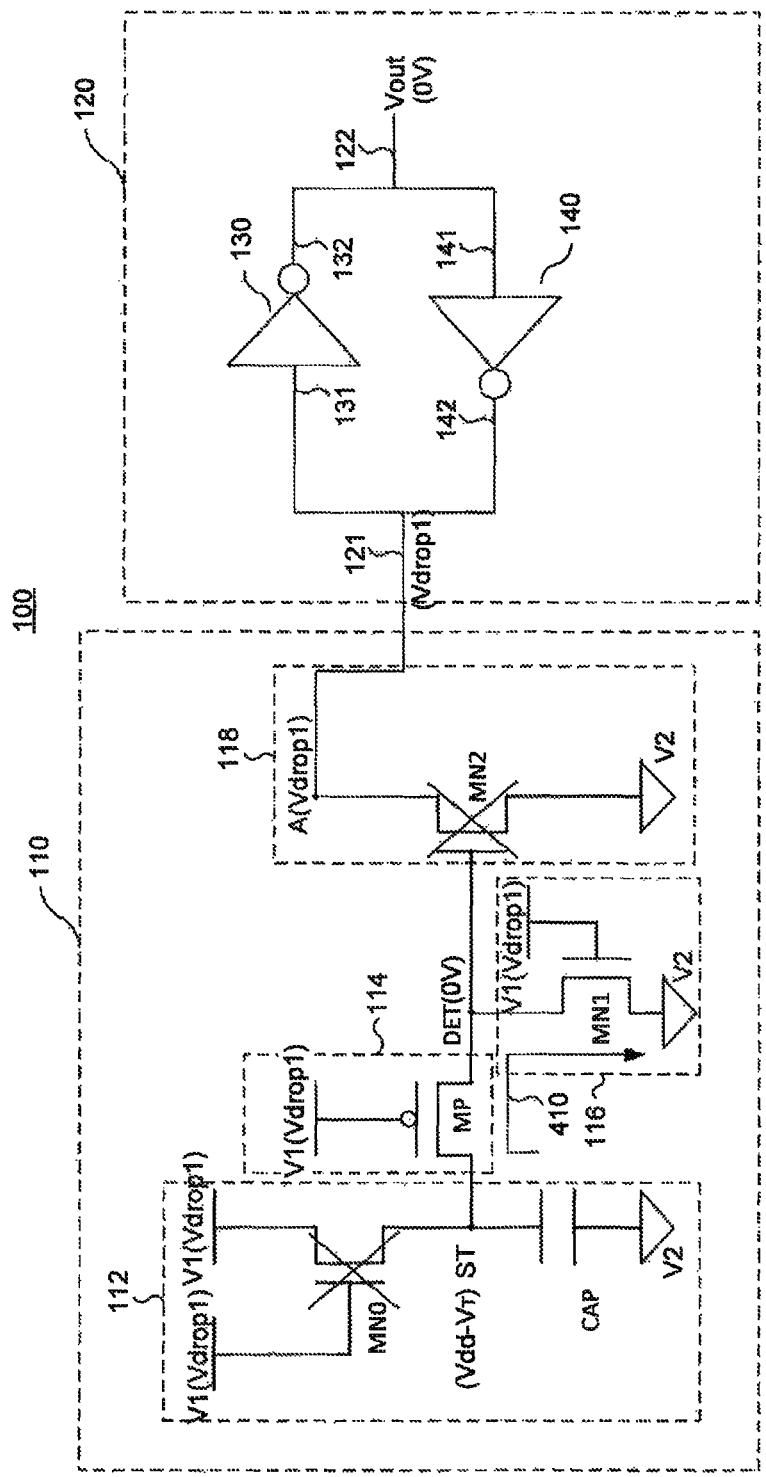
FIG. 4 is a circuit diagram of the power drop detector circuit of FIG. 1 in a first power drop scenario, according to an illustrated embodiment.

FIG. 4 is a circuit diagram of circuit 100 in a first power drop scenario, according to an illustrated embodiment. In the first power drop scenario, the first source voltage V1 drops to a first voltage level Vdrop1, which is higher than or equal to the threshold voltage $V_T$ of transistors MN0, MN1, MN2, and MP, and is lower than or equal to (Vdd-2$V_T$). That is, $V_T \leq Vdrop1 \leq Vdd-2V_T$.

As illustrated in FIG. 4, when the first source voltage V1 drops to Vdrop1, because voltage $V_{ST}$ at node ST is latched at Vdd-$V_T$ by latching circuit 112, the gate to source voltage Vgs of NMOS transistor MN0 becomes Vdrop1-(Vdd-$V_T$), which is less than $V_T$. Therefore, NMOS transistor MN0 remains turned off. At the same time, the gate to source voltage Vgs of PMOS transistor MP also becomes Vdrop1-(Vdd-$V_T$). Because Vdrop1≤Vdd-2$V_T$, Vgs of PMOS transistor MP is lower than or equal to Vdd-2$V_T$-(Vdd-$V_T$)=-$V_T$. Therefore, PMOS transistor MP of pull-up circuit 114 is turned on, In addition, because the gate to source voltage Vgs of NMOS transistor MN1 of pull-down circuit 116 becomes Vdrop1, NMOS transistor MN1 remains turned on. As a result, PMOS transistor MP of pull-up circuit 114 and NMOS transistor MN1 of pull-down circuit 116 conduct a current 410 that discharge capacitor CAP through node ST, PMOS transistor MP, detector node DET, NMOS transistor MN1, to ground. Therefore, charge from capacitor CAP cannot accumulate, and voltage $V_{DET}$ at detector node DET remains as 0V. Consequently, NMOS transistor MN2 of memory control circuit 118 remains turned off. As a result, voltage $V_A$ remains equal to the first source voltage V1, i.e., Vdrop1, and voltage Vout remains as 0V. Memory element 120 remains in the first memory state, indicating that the first source voltage V1 does not drop below the trigger level $V_T$.

Figure 5:
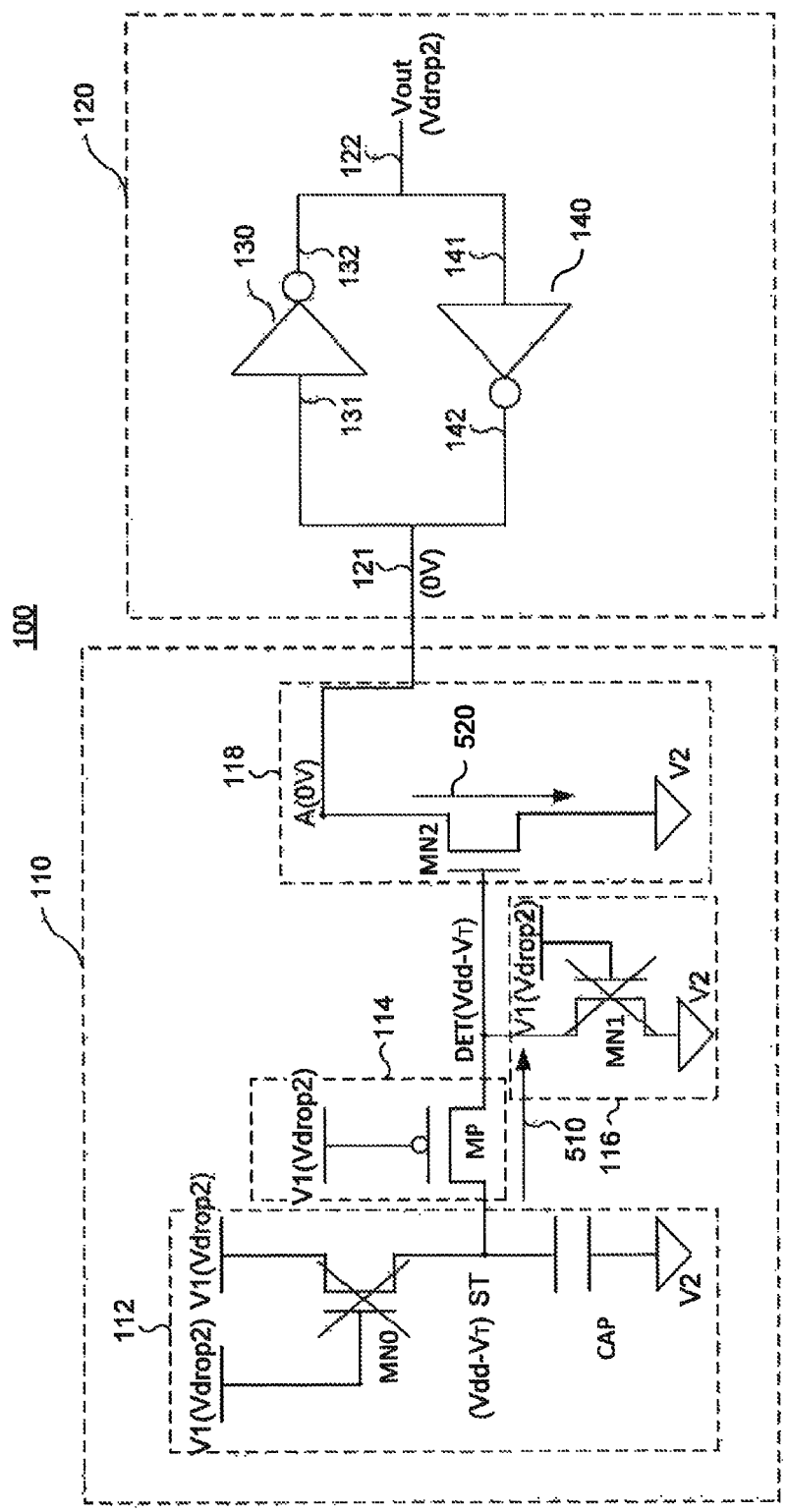
FIG. 5 is a circuit diagram of the power drop detector circuit of FIG. 1 in a second power drop scenario, according to an illustrated embodiment.

FIG. 5 is a circuit diagram of circuit 100 in a second power drop scenario, according to an illustrated embodiment. In the second power drop scenario, the first source voltage V1 drops to a second voltage level Vdrop2, which is lower than or equal to the threshold voltage $V_T$ of transistors MN0, MN1, MN2, and MP. That is, Vdrop2≤$V_T$.

As illustrated in FIG. 5, when the first source voltage V1 drops to Vdrop2, because voltage $V_{ST}$ at node ST is latched at Vdd-$V_T$ by latching circuit 112, the gate to source voltage Vgs of NMOS transistor MN0 becomes Vdrop2-(Vdd-$V_T$), which is less than $V_T$. Therefore, NMOS transistor MN0 remains turned off. At the same time, the gate to source voltage Vgs of PMOS transistor MP also becomes Vdrop2-(Vdd-$V_T$). Because Vdrop2≤$V_T$ and $V_T$<Vdd-2$V_T$, Vgs of PMOS transistor MP is lower than -$V_T$. Therefore, PMOS transistor MP of pull-up circuit 114 is turned on and conducts a current 510 from node ST to detector node DET. As a result, capacitor CAP starts discharging by current 510. At the same time, because the gate to source voltage Vgs of NMOS transistor MN1 of pull-down circuit 116 becomes Vdrop2 and Vdrop2≤$V_T$, NMOS transistor MN1 is turned off. Therefore, charge from capacitor CAP accumulates at detector node DET, and thus voltage $V_{DET}$ at detector node DET increases from 0V until it reaches Vdd-$V_T$, which is the same as voltage $V_{ST}$ at node ST. In other words, pull-up circuit 114 pulls voltage $V_{DET}$ up from 0V to voltage $V_{ST}$=Vdd-$V_T$. When voltage $V_{DET}$ reaches Vdd-$V_T$, the gate to source voltage Vgs of NMOS transistor MN2 is Vdd−$V_T$, which is higher than $V_T$. As a result, NMOS transistor MN2 of memory control circuit 118 is turned on, and conducts a current 520 from node A to second source voltage V2 to couple node A to second source voltage V2. Voltage $V_A$ at node A, which is connected to memory input node 121, is coupled to second source voltage V2 by current 520, and Vout at the output node of memory element 120 is coupled to first source voltage V1 (i.e., Vdrop2). As a result, memory element 120 is switched to the second memory state, indicating that first source voltage V1 drops below a trigger level of $V_T$.

In summary, circuit 100 illustrated in FIGS. 1-5 operates to detect whether or not a voltage level of first source voltage V1 drops below the trigger level of $V_T$. However, the present disclosure is not so limited. The trigger level can have a different value, as described below.

Figure 6:
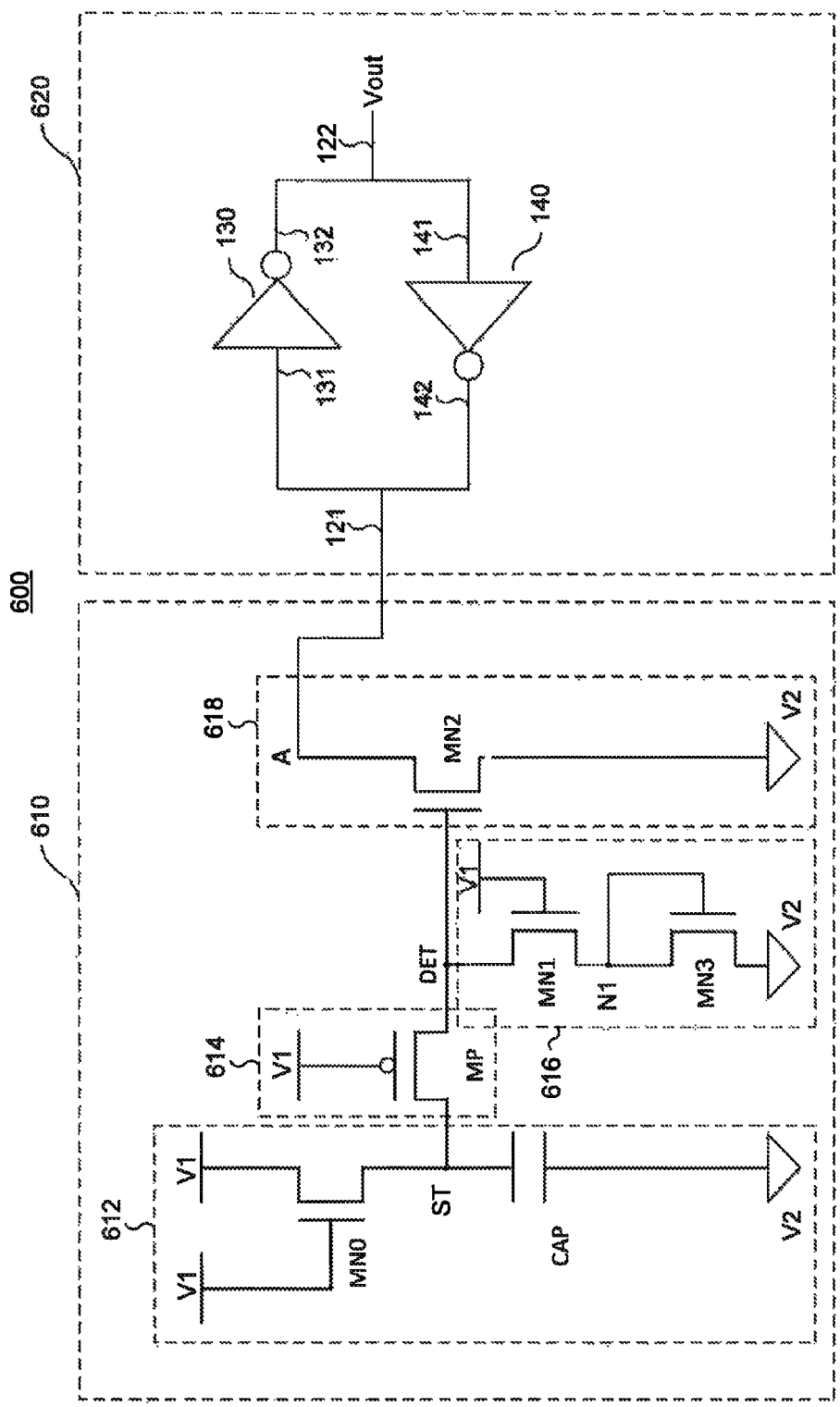
FIG. 6 is a circuit diagram of a power drop detector circuit, according to an illustrated embodiment.

FIG. 6 is a circuit diagram of a power drop detector circuit 600 (hereinafter referred to as "circuit 600"), according to an illustrated embodiment. Circuit 600 includes a detect element 610 and a memory element 620. Detect element 610 includes a latching circuit 612, a pull-up circuit 614, a pull-down circuit 616, and a memory control circuit 618. Latching circuit 612, pull-up circuit 614, memory control circuit 618, and memory element 620 have structures similar to those of latching circuit 112, pull-up circuit 114, memory control circuit 118, and memory element 120, respectively, illustrated in FIG. 1. Therefore, detailed description of these elements is not provided.

Unlike pull-down circuit 116, pull-down circuit 616 includes NMOS transistors MN1 and MN3 coupled in series between detector node DET and second source voltage V2. Specifically, NMOS transistor MN1 includes a drain terminal coupled to detector node DET, a source terminal coupled to an intermediate node N1, and a gate terminal coupled to receive the first source voltage V1. NMOS transistor MN3 includes a drain terminal and a gate terminal both coupled to node N1, and a source terminal coupled to second source voltage V2, e.g., ground.

The operation of circuit 600 is similar to that of circuit 100, except that the trigger level of circuit 600 changes from $V_T$ to $2 \times V_T$ due to the presence of NMOS transistor MN3. Specifically, during normal operation, pull-up circuit 614 is turned off, pull-down circuit 616 is turned on, memory control circuit 618 is turned off, voltage $V_{ST}$ at node ST is latched at Vdd−$V_T$ by latching circuit 112, voltage $V_{DET}$ at node DET is 0V, and voltage $V_{N1}$ at node N1 is 0V. Therefore, memory element 620 is maintained at the first memory state. When the voltage level of the first source voltage V1 drops below $2 \times V_T$, pull-up circuit 614 is turned on, voltage $V_{N1}$ at node N1 increases due to the charge on capacitor CAP to become $V_T$, and thus pull-down circuit 616 is turned off. Consequently, voltage $V_{DET}$ at detector node DET increases from 0V to Vdd−$V_T$, which is the voltage $V_{ST}$ at node ST. NMOS transistor MN2 of memory control circuit 618 is turned on by the voltage Vdd−$V_T$ applied at its gate terminal. As a result, voltage $V_A$ at node A, which is connected to memory input node 121, is coupled to second source voltage V2 by NMOS transistor MN2, and Vout at the output node of memory element 120 is coupled to first source voltage V1 (i.e., Vdrop2). Consequently, memory element 120 is switched to the second memory state, indicating that first source voltage V1 drops below a trigger level of $V_T$.

Figure 7:
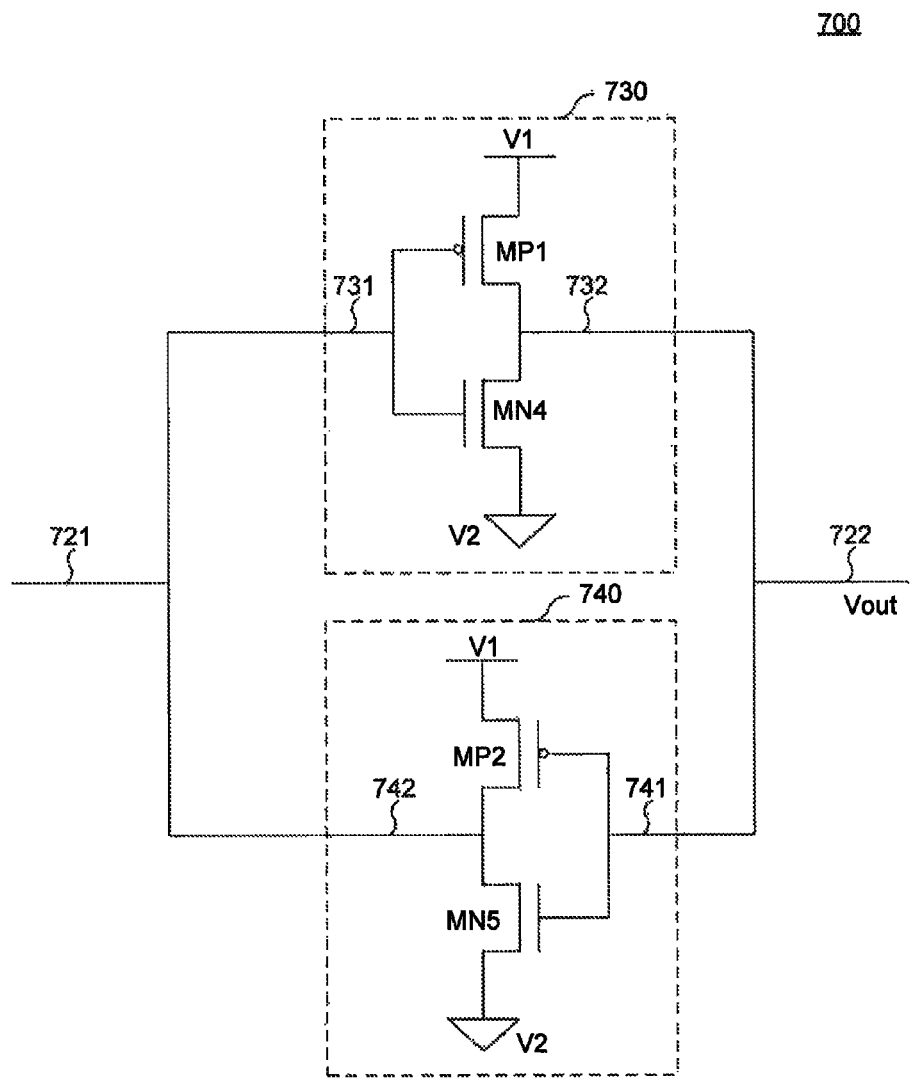
FIG. 7 is a circuit diagram of a memory element, according to an illustrated embodiment.

FIG. 7 is a circuit diagram of a memory element 700, according to an illustrated embodiment. Memory element 700 can be applied as memory element 120 in power drop detector circuit 100, or memory element 620 in power drop detector circuit 600.

As illustrated in FIG. 7, memory element 700 includes a memory input node 721, a memory output node 722, and a first inverter 730 and a second inverter 740 coupled between memory input node 721 and memory output node 722. First inverter 730 includes an input terminal 731 coupled to memory input node 721, and an output terminal 732 coupled to memory output node 722. Second inverter 740 includes an input terminal 741 coupled to memory output node 722, and an output terminal 742 coupled to memory input node 121.

More specifically, first inverter 730 includes a PMOS transistor MP1 and an NMOS transistor MN4 coupled in series between first source voltage V1 and second source voltage V2, e.g., ground. PMOS transistor MP1 includes a source terminal coupled to first source voltage V1, a gate terminal coupled to input terminal 731, and a drain terminal coupled to output terminal 732. NMOS transistor MN4 includes a drain terminal coupled to output terminal 732, a gate terminal coupled to input terminal 731, and a source terminal coupled to second source voltage V2. Second inverter 740 includes a PMOS transistor MP2 and an NMOS transistor MN5 coupled in series between first source voltage V1 and second source voltage V2. PMOS transistor MP2 includes a source terminal coupled to first source voltage V1, a gate terminal coupled to input terminal 741, and a drain terminal coupled to output terminal 742. NMOS transistor MN5 includes a drain terminal coupled to output terminal 742, a gate terminal coupled to input terminal 741, and a source terminal coupled to second source voltage V2.

When the voltage level at input node 721 of memory element 700 is coupled to second voltage source V2, i.e, 0V, which corresponds to the normal operation illustrated in FIG. 3 or the first power drop scenario illustrated in FIG. 4, PMOS transistor MP1 is turned on and NMOS transistor MN4 is turned off. Thus, output node 722 of memory element 700 is coupled to first source voltage V1, i.e., to a "high" voltage. The "high" voltage at output node 722 turns off PMOS transistor MP2 and turns on NMOS transistor MN5, and thus input node 721 remains coupled to second source voltage V2. On the other hand, when the voltage level at input node 721 of memory element 700 is coupled to first voltage source V1, which corresponds to the second power drop scenario illustrated in FIG. 5, PMOS transistor MP1 is turned off and NMOS transistor MN4 is turned on. Thus, output node 722 of memory element 700 is coupled to second source voltage V2, i.e., to a "low" voltage. The "low" voltage at output node 722 turns on PMOS transistor MP2 and turns off NMOS transistor MN5, and thus input node 721 remains coupled to first source voltage V1.

In memory element 700, PMOS transistor MP1 is configured to be stronger than PMOS transistor MP2, and NMOS transistor MN4 is configured to be weaker than NMOS transistor MN5. That is, the resistance of PMOS transistor MP1 when it is turned on is smaller than the resistance of PMOS transistor MP2 when it is turned on, and the resistance of NMOS transistor MN4 when it is turned on is larger than the resistance of NMOS transistor MN5 when it is turned on. For example, the widths of MP1 and MN5 can be made greater than the widths of MP2 and MN4, respectively, and/or the lengths of MP1 and MN5 can be made smaller than the lengths of MP2 and MN4, respectively. In addition, input node 721 is configured to be free of a leak path from first source voltage V1, and output node 722 is configured to be free of a leak path from second source voltage V2. In this way, after the initialization operation, the voltage at input node 721 is second source voltage V2, and the voltage at output node 722 is first source voltage V1.

Power drop detector circuits 100 and 600 described above can be used to detect whether or not first source voltage V1 drops below a trigger level. In addition, power drop detector circuits 100 and 600 do not consume any power during normal operation. Therefore, power drop detector circuits 100 and 600 can be used in memory devices operated in a low power consumption mode.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A power drop detector circuit, comprising:
a detect element, for coupling to a first source voltage, for detecting a voltage level of the first source voltage; and
a memory element coupled to the detect element and switchable between a first memory state and a second memory state based on the voltage level of the first source voltage,
wherein the detect element includes a latching circuit, for coupling between the first source voltage and a second source voltage and controlled by the first source voltage,
the latching circuit including a latching node, and the detect element includes:
a pull-up circuit coupled between the latching node and a detector node and controlled by the first source voltage;
a pull-down circuit coupled between the detector node and the second source voltage and controlled by the first source voltage; and
a memory control circuit coupled to an input node of the memory element and controlled by a detector voltage at the detector node.

2. The power drop detector circuit of claim 1, wherein the memory element includes:
a first inverter including an input terminal coupled to the input node of the memory element and an output terminal coupled to an output node of the memory element; and
a second inverter including an input terminal coupled to the output node of the memory element and an input terminal coupled to the input node of the memory element.

3. The power drop detector circuit of claim 1, wherein, during a normal operation when the voltage level of the first source voltage does not drop below a trigger level,
the latching circuit is configured to latch a voltage at the latching node at a first voltage level, and
the pull-down circuit is configured to turn on to pull the detector voltage to the second source voltage.

4. The power drop detector circuit of claim 3, wherein, responsive to the detector voltage being the second source voltage,
the memory control circuit is configured to turn off, and
the memory element is configured at the first memory state.

5. The power drop detector circuit of claim 4, wherein, responsive to the detector voltage being the first voltage level,
the memory control circuit is configured to turn on to couple the input node of the memory element to the second source voltage, and the memory element is configured at the second memory state.

6. The power drop detector circuit of claim 3, wherein, when the voltage level of the first source voltage drops below the trigger level,
the pull-down circuit is configured to turn off, and
the pull-up circuit is configured to turn on to pull the detector voltage to the first voltage level.

7. The power drop detector circuit of claim 1, wherein the latching circuit includes:
an N-channel transistor having a drain terminal for coupling to the first source voltage, a source terminal coupled to the latching node, and a gate terminal for coupling to the first source voltage; and
a capacitor having a first terminal coupled to the latching node and a second terminal for coupling to the second source voltage.

8. The power drop detector circuit of claim 1, wherein the pull-up circuit includes:
a P-channel transistor coupled between the latching node and the detector node, and having a gate terminal for coupling to the first source voltage.

9. The power drop detector circuit of claim 1, wherein the pull-down circuit includes:
an N-channel transistor having a drain terminal coupled to the detector node, a source terminal for coupling to the second source voltage, and a gate terminal for coupling to the first source voltage.

10. The power drop detector circuit of claim 1, wherein the pull-down circuit includes:
a first N-channel transistor having a drain terminal coupled to the detector node, a source terminal coupled to an intermediate node, and a gate terminal for coupling to the first source voltage; and
a second N-channel transistor having a drain terminal coupled to the intermediate node, a source terminal for coupling to the second source voltage, and a gate terminal coupled to the intermediate node.

11. The power drop detector circuit of claim 1, wherein the memory control circuit includes:
an N-channel transistor having a drain terminal coupled to the input node of the memory element, a source terminal for coupling to the second source voltage, and a gate terminal coupled to the detector node.

12. A method for operating a power drop detector circuit, comprising:
providing a detect element for detecting a voltage level of a first source voltage and a memory element switchable between a first memory state and a second memory state; and
in response to the voltage level of the first source voltage dropping below a trigger level, switching the memory element from the first memory state to the second memory state,
wherein providing the detect element includes providing a latching circuit coupled between the first source voltage and a second source voltage and controlled by the first source voltage,
the latching circuit including a latching node, and
providing the detect element includes:
providing a pull-up circuit coupled between the latching node and a detector node and controlled by the first source voltage;
providing a pull-down circuit coupled between the detector node and the second source voltage and controlled by the first source voltage; and providing a memory control circuit coupled between an input node of the memory element and the second source voltage and controlled by a detector voltage at the detector node.

13. The method of claim 12, including, responsive to the voltage level of the first source voltage being greater than the trigger level, latching a voltage at the latching node at a first voltage level, and turning on the pull-down circuit to pull the detector voltage to the second source voltage.

14. The method of claim 13, including, responsive to the detector voltage being the second source voltage, turning off the memory control circuit, and setting the memory element at the first memory state.

15. The method of claim 12, including, responsive to the voltage level of the first source voltage dropping below the trigger level, turning off the pull-down circuit, and turning on the pull-up circuit to pull the detector voltage to a first voltage level.

16. The method of claim 15, including, responsive to the detector voltage being the first voltage level, turning on the memory control circuit to couple the input node of the memory element to the second source voltage, and setting the memory element at the second memory state.

17. The method of claim 12, wherein providing the memory element includes:

providing a first inverter including an input terminal coupled to the input node of the memory element and an output terminal coupled to an output node of the memory element; and providing a second inverter including an input terminal coupled to the output node of the memory element and an output terminal coupled to the input node of the memory element.

* * * * *